(12) United States Patent
Cuthbert

(10) Patent No.: US 6,248,485 B1
(45) Date of Patent: Jun. 19, 2001

(54) METHOD FOR CONTROLLING A PROCESS FOR PATTERNING A FEATURE IN A PHOTORESIST

(75) Inventor: John David Cuthbert, Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/356,638

(22) Filed: Jul. 19, 1999

(51) Int. Cl.$^7$ .......................................... G03F 9/00
(52) U.S. Cl. ................................................. 430/30
(58) Field of Search .................................. 430/30

(56) References Cited

U.S. PATENT DOCUMENTS 5,994,009 * 11/1999 Tzu et al. .............................. 430/30

* cited by examiner

Primary Examiner—Christopher G. Young
(74) Attorney, Agent, or Firm—Stroock & Stroock & Lavan LLP

(57) ABSTRACT

A method and controller for controlling a process and system for patterning a feature in a photoresist on a semiconductor wafer. The present invention characterizes various components (both individually and collectively) of an image transfer system, including the illumination source, lens and product reticle, with regard to dimensional errors introduced into the image transfer process by these components. The collective error data or information provided in accordance with the present invention may be communicated to the image transfer system to control the image transfer system and the image transfer process and to ensure that the actual dimension of features patterned in the photoresist are within acceptable dimensional limits for these features.

18 Claims, 3 Drawing Sheets

METHOD FOR CONTROLLING A PROCESS FOR PATTERNING A FEATURE IN A PHOTORESIST

FIELD OF THE INVENTION

The present invention relates to image transfer processes and systems and, more particularly, to a method and controller for controlling a process and system for patterning a feature in a photoresist on a semiconductor wafer.

BACKGROUND OF THE INVENTION

Features defined in a semiconductor may be characterized by a critical dimension CD (i.e., a target critical dimension), which is typically specified by a chip designer. A target critical dimension specification provides upper and lower limits of the critical dimension. The features formed in the photoresist (i.e., an actual dimension) must be within the target critical dimension specification.

Unfortunately, the various systems and components used in an image transfer process to form features in a photoresist on a semiconductor wafer provide a multiplicity of error sources across an image field. Further, an error at one point in the image field may be different than an error at another point in the image field.

For example, the image transfer system, which includes an illumination source and a lens, will introduce errors into the image transfer process. One source of errors is the illumination source, which may not provide a uniform output intensity, thus causing the light energy impinging on the photoresist surface to vary. The local degree of partial coherence, which is difficult to control, is another source of error in the image transfer process. Lens aberrations provide yet another source or error. Still another source of error is the product reticle or mask, which provides the feature pattern for the photoresist. Due to manufacturing device limitations, dimensions of the features defined on the reticle deviate from target dimensions. Many image transfer systems use reduction optics with a magnification ratio, M, such that the pitch (P) of reticle features is imaged into the photoresist with a pitch of P/M. The effective width (W) of a reticle feature is W/M. For purposes of this disclosure, M=1, but the present invention is not limited to M=1. Consequently, the actual dimensions of features formed in the photoresist will likely deviate from the target critical dimension and may fall outside the limits of the target critical dimension specification.

Commonly, reticles include lithographic control features (LCFs) which are used to determine the amount of deviation between target and actual dimensions. When features are formed in the photoresist, a resulting LCF formed in the photoresist may be measured to determine a deviation between its actual dimension and the target critical dimension. The deviation information is useful to determine if that resulting LCF feature has an actual dimension that is within the limits defined by the target critical dimension specification. Unfortunately, the actual dimension of that resulting LCF does not directly correlate with the actual dimensions of other features defined by the reticle pattern and formed in the photoresist. This occurs because the errors may vary across the image field. Thus, measuring the dimensional deviation of the LCF does not necessarily provide useful information on the actual dimensional deviation for non-LCF features and whether they fall within the specification limits. Clearly, the information obtained via the LCF critical dimension deviation is generally inadequate to control or adjust downstream processing steps and devices when significant reticle errors and image transfer errors are present—as they always are.

There thus exists a need in the art for a method of controlling the critical dimension of features patterned in a photoresist on a semiconductor wafer that overcomes the above-described shortcomings of the prior art.

SUMMARY OF THE INVENTION

The present invention is directed to a method and controller for controlling a process and system for patterning a feature in a photoresist on a semiconductor wafer. The present invention characterizes various components (both individually and collectively) of an image transfer system, including the illumination source, lens and product reticle, with regard to errors introduced into the image transfer process by these components. The collective error data or information provided in accordance with the present invention may be communicated to the image transfer system to control the image transfer system and the image transfer process.

The present invention is directed to a method of controlling an image transfer process for patterning a feature in a photoresist on a semiconductor wafer using an image transfer system having a plurality of image transfer components, at least one of the image transfer components introducing a critical dimension (CD) error in the image transfer process. The method preferably comprises quantifying the error introduced in the image transfer process by the image transfer system and adjusting the image transfer system to compensate for the error.

In a preferred embodiment, the present invention comprises a method of controlling a critical dimension of a feature patterned in a photoresist disposed on a semiconductor wafer. The feature being patterned has a target critical dimension and a target critical dimension specification (i.e., permissible line width deviation). The feature is patterned using an image transfer system that includes an illumination source, a lens, and a product reticle having a plurality of features defined therein and forming a reticle feature pattern. The reticle is disposed in the image transfer system, preferably between the lens and illumination source which directs light energy through the product reticle and lens to define the reticle feature pattern in the photoresist. The method comprises forming a product reticle error matrix $\Delta(x,y)$ of discrete error values and forming an image transfer system error matrix $\delta(x,y)$ of discrete error values. The present invention then derives an effective corrected reticle error matrix $\Delta c(x,y)$ from the combination of the product reticle error matrix $\Delta(x,y)$ and the image transfer system error matrix $\delta(x,y)$. An effective corrected reticle size (ECRS) for the product reticle is defined as the sum of the target critical dimension ($CD_{Target}$) and $\Delta c(x,y)$. A maximum error value and a minimum error value are selected from the effective corrected reticle error matrix. To account for the fact that the discrete points of the matrices (e.g., product reticle error matrix and image transfer system matrix) may or may not be conjugate with each other (in obvious notation—$CD_{Target}+(\Delta c(max)+\Delta c(min))/2$), a computer may be used to construct an error profile or surface for each of the reticle and image transfer system from the discrete error points in the respective error matrices. Similarly, a computer may be used to combine the error profiles to form an effective corrected reticle error profile. The present invention may then control the image transfer system, namely the exposure dose (i.e., duration and intensity), to insure that the maximum and minimum error values are within the target critical dimension specification. The exposure (E) that will place the minimum and maximum error values symmetrically within the upper and lower critical specification limits is defined by the equation:

$$ECD_{Target}+(dE/dCD)((\Delta c(\max)+\Delta c(\min))/2).$$

At this exposure, the expected critical dimension of a lithographic control feature (LCF) located at an arbitrary point (x,y) in the image field is:

$$CD_{Target}+\Delta c(x,y)+((\Delta c(\max)+\Delta c(\min))/2).$$

The present invention thus provides maximum exposure latitude for keeping all actual dimensions within the specification limits.

The present invention is also directed to a controller for an image transfer system having a plurality of image transfer components. The image transfer system transfers a feature defined in a product reticle into a photoresist disposed on a semiconductor wafer in an image transfer process. The feature defined by the product reticle has a target critical dimension and defines a target critical dimension specification, and the feature transferred by the image transfer process has an actual dimension which is determined by the adjusted reticle size of that feature and the exposure. The controller receives error data with regard to an image transfer component, and comprises means for considering the data received with regard to an image transfer component, and means for controlling the image transfer system in view of the received error data to ensure that the actual dimension of the feature transferred into the photoresist is within the adjusted target critical dimension specification.

The present invention is also directed to an image transfer system for patterning a feature in a photoresist on a semiconductor wafer in an image transfer process. The image transfer system includes an illumination source and a lens disposed with respect thereto for receiving and directing light from the illumination source. The system also includes a product reticle disposed between the lens and the semiconductor wafer for receiving light from the illumination source. The inventive image transfer system also includes a controller for considering error data with regard to the image transfer system and for controlling the image transfer system so that the actual dimension of a feature patterned in the photoresist is within a target critical dimension specification for the feature.

The present invention is further directed to a semiconductor device having a feature defined therein formed in accordance with the methods disclosed herein.

The present invention is also directed to a method for manufacturing an integrated circuit employing an imaging method for an imaging system using a reticle. The manufacturing method comprises providing an image system error profile of the imaging system and a reticle error profile of the reticle. The imaging system error profile and the reticle error profile are combined to determine at least one of a maximum error value and a minimum error value. The imaging system is then adjusted in response to one of the maximum error value and a minimum error value.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference characters denote similar elements throughout the several views.

DETAILED DESCRIPTION OF THE PRESENTLY PREFERRED EMBODIMENTS

The present invention is directed to controlling the dimensions of features patterned in a photoresist of a semiconductor wafer. More specifically, the present invention considers the maximum and minimum error values across an image field introduced in an image transfer process by various components of an image transfer system (including the illumination source, lens and product reticle), and controls the image transfer system so that these maximum and minimum error values fall within a target critical dimension specification for the feature being patterned in the semiconductor photoresist.

The present invention utilizes an effective corrected reticle error matrix (which is a combination of an image transfer system matrix and a product reticle error matrix) to control the dimensions of a lithographic control feature (LCF), namely, to ensure that the dimensions of the LCF are within the upper and lower limits of the critical dimension specification.

Figure 1:
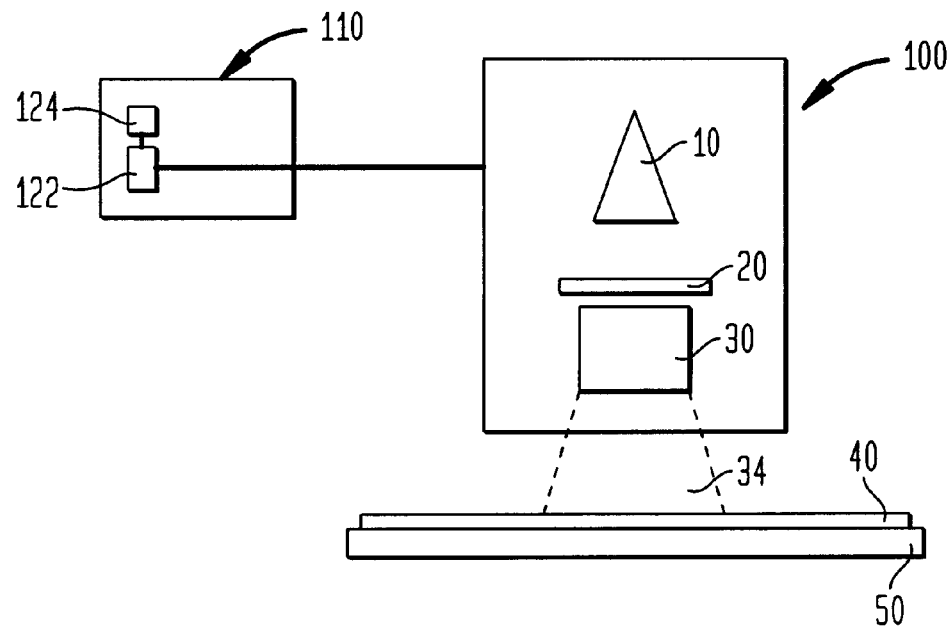
FIG. 1 is a block diagram of an image transfer system and a semiconductor wafer disposed therebeneath.
Figure 2:
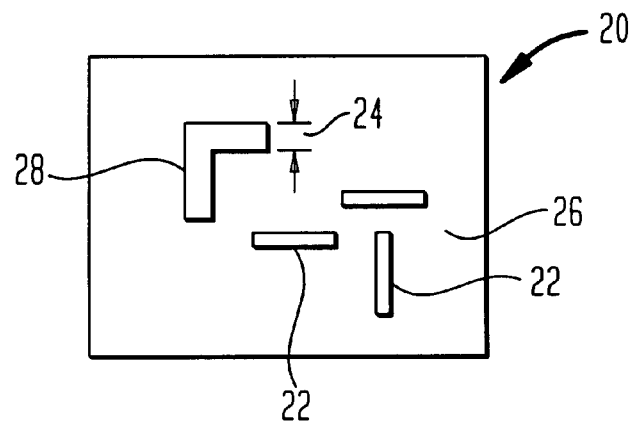
FIG. 2 is a top view of a product reticle used in the image transfer system depicted in FIG. 1.
Figure 3:
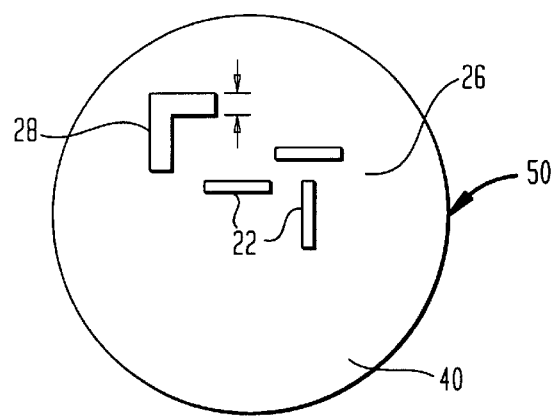
FIG. 3 is a top view of the semiconductor wafer depicted in FIG. 1.

Referring now to the drawings in detail, FIGS. 1 and 2 respectively depict an image transfer system 100 and a product reticle 20 used in conjunction therewith for exposing a plurality of features on a photoresist film 40 disposed on a semiconductor wafer 50 (FIG. 3). The image transfer system 100 includes an illumination source 10 and a lens 30 that defines a focal volume 34. A controller 110 connected to the image transfer system 100 may control various parts of the system 100, such as the exposure time and exposure intensity of the illumination source 10, for example. The controller may include a microprocessor 122 and a memory storage device 124.

The image transfer system 100 includes a product reticle 20 that is preferably disposed between the illumination source 10 and lens 30 and that has a plurality of features 22 defined therein. The reticle 20 serves as a template or mask for the quantity, shape, location and size of features 22 to be defined in the semiconductor wafer 50 (via the photoresist 40).

As depicted in FIG. 2, the plurality of features 22 collectively define a reticle feature pattern 26. At least one feature 22 is a lithographic control feature (LCF) 28 that may be used to calibrate or otherwise measure or determine the performance of the image transfer system 100 (as described in more detail below). Each feature 22 has a target critical dimension, and a reticle 20 may include a plurality of features '22 all having the same target critical dimension. The target critical dimension depends, at least in part, on the specific type of semiconductor device being fabricated, on the specific type of feature (e.g., interconnection path, transistor gate, etc.), and is typically specified by the chip designer. While the detailed description herein is directed to a single target critical dimension on a reticle 20, the present invention also contemplates a plurality of target critical dimensions, the detailed description being merely illustrative and not intended to limit the scope of the present invention.

A semiconductor wafer 50 (FIG. 3) having a photoresist 40 disposed thereon is preferably removably placed beneath the lens 30 of the image transfer system 100. Using known methods and devices, the wafer 50 is moved and positioned within the focal volume 34 and the illumination source 10 is caused to expose the photoresist 40 to the image of the reticle feature pattern 26. More specifically, the illumination source 10 is caused to direct light energy through the reticle 20 and onto the photoresist 40 (in the image field) for a predetermined time and at a predetermined intensity during an image transfer process. A plurality of features 22 defined by the reticle pattern 26 are thereby exposed into the photoresist 40 (and ultimately into the semiconductor wafer 50). Since the wafer 50 is typically larger than the focal volume 34, the wafer 50 is moved and positioned a predetermined number of times to expose the entire photoresist 40. Of course, the number of times the wafer 50 is moved may depend upon: (1) the number of transistors and other features being patterned in the photoresist; (2) the size of the focal volume 34 relative to the size of the wafer 50; and (3) other factors that are not relevant to the present invention and that are generally known in the art.

Typically, imperfections in the image transfer system 100 and reticle 20 adversely affect accurate transfer of the features defined by the reticle pattern 26 into the photoresist 40. Consequently, the actual dimension of the features patterned in the photoresist 40 ($CD_{Actual}$) may deviate from the target critical dimension ($CD_{Target}$). The present invention quantifies (i.e., characterizes) imperfections in image transfer system components, namely the illumination source 10, lens 30 and product reticle 20, and adjusts, for example, the exposure duration and intensity of the image transfer system 100 to provide a process in which the CDs are optimally sized to provide maximum process latitude for keeping all the CDs within the critical dimension specification limits.

Depending upon the type of device to be fabricated in the semiconductor wafer 50, the features defined therein may have a different target critical dimension. As used herein, the term target critical dimension or $CD_{Target}$ refers to a dimension typically specified by a designer for a particular set of features such as transistor gates, for example, and is the desired dimension for a particular set of features defined in the photoresist 40. A target critical dimension may be characterized by a target critical dimension specification that defines a permissible range of deviation from the target critical dimension. Thus, the critical dimension of a feature formed in the photoresist 40 (referred to herein as an actual critical dimension $CD_{Actual}$) may be acceptable if it is within the target critical dimension specification. For example, a designer may specify a target critical dimension of 200 nm±20 nm, with features having actual critical dimensions between 205 and 195 nm being acceptable.

The present invention characterizes errors introduced by the various components that comprise the image transfer system 100. In a preferred embodiment, the present invention characterizes the illumination source 10, lens 30 and product reticle 20, although additional and/or different image transfer system components may be characterized in accordance with the present invention. As used herein, the term characterize and characterizes refers to the identification and quantification of errors introduced in the image transfer process by various components of the image transfer system 100. The specific components discussed herein (e.g., illumination source 10, lens 30 and product reticle 20) are provided as illustrative, non-limiting examples. It will be obvious to persons skilled in the art that any component, device, apparatus, etc., used in the image transfer process may be characterized in accordance with the present invention so as to account for errors introduced into the image transfer process by such other components, devices, and apparatuses.

Figure 4:
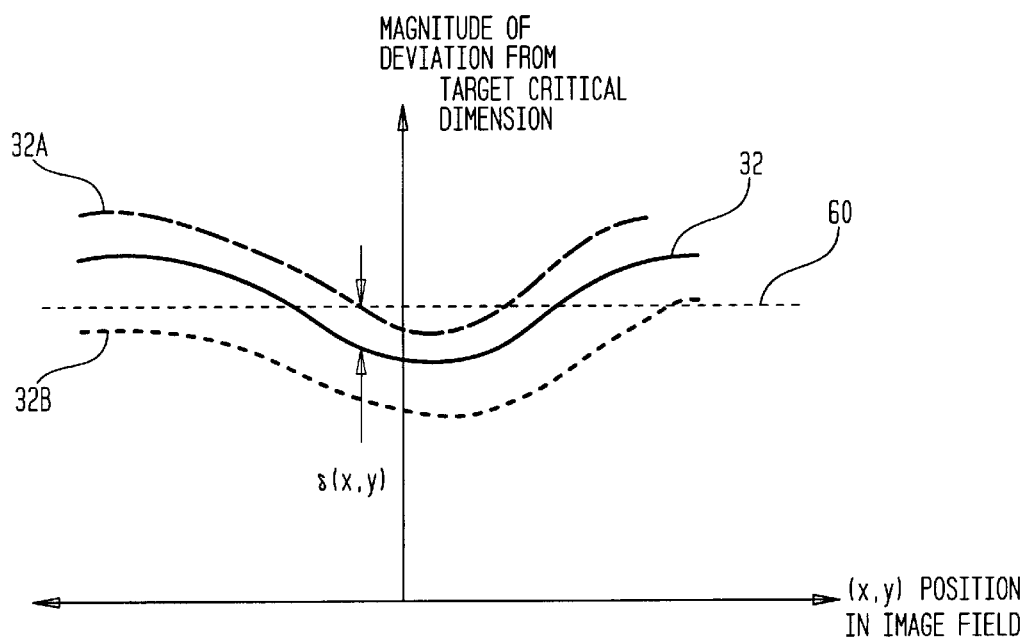
FIG. 4 is a graphical illustration of an error profile derived from an error matrix for the image transfer system depicted in FIG. 1.

Addressing first the illumination source 10 and lens 30, and with reference to FIG. 4, the image transfer process is characterized so that imperfections in these various components, and the errors introduced in the image transfer process as a result thereof, may be quantified. The characterization of the illumination source 10 and lens 30 is typically accomplished by a system operator. Illustratively, using known processes and devices, a test reticle is fabricated under extremely tight manufacturing constraints to ensure that it introduces virtually no dimensional errors into the image transfer process. The test reticle is then used to characterize the errors introduced by the image transfer system 100, including the illumination source 10 and lens 30 across the image field. The test reticle includes a plurality of LCFs defined and arranged therein in a predetermined configuration (e.g., in a 10×10 matrix), each feature having a dimension that is essentially the same as the target critical dimensions specified by the chip designer. The test reticle is used to expose a test reticle feature or a plurality of test reticle features (i.e., a test reticle pattern) in a photoresist on a semiconductor wafer. The exposure dose (duration and intensity) is chosen so that the actual dimension of the features patterned in the photoresist do not deviate to any significant degree from the target critical dimension. However, at any point (x,y) in the image field, there will be a deviation from the target critical dimension. Using a scanning electron microscope, or other known precision measuring device or system, the actual dimension of the test feature(s) patterned in the photoresist are measured and compared with the target critical dimension to determine the amount of error introduced in the image transfer process by the illumination source 10 and lens 30. Measurements are taken at a plurality of locations on the photoresist 40 to develop an image transfer system error matrix δ(x,y) that provides the location and magnitude of errors introduced by the illumination source 10 and lens 30. From this image transfer system error matrix, an image transfer system error profile, depicted by line 32 in FIG. 4, may be derived using known techniques (e.g., a best-fit curve software program on a computer). Line 32 of FIG. 4 represents the case of a fixed x or y point, where the other point varies. Thus, the illumination source 10 and lens 30 may be characterized across the image field with respect to the target critical dimension so that errors introduced into the image transfer process by these components may be quantified and accounted for in adjusting and controlling the image transfer process and the image transfer system 100.

FIG. 4 also depicts the effect of varying the exposure dose of the image transfer system 100 on the dimensions of features formed in the photoresist. For example, when using a positive photoresist and a black on clear reticle, by reducing the exposure dose, the dimensions of features formed in the photoresist tend to increase, as depicted by line 32a. If, on the other hand, the exposure dose is increased, the dimensions of features in the photoresist will tend to decrease, as depicted by line 32b. As lines 32, 32a and 32b represent best-fit curves of deviations between an actual critical dimension and a target critical dimension, line 60 represents the case where the difference between the actual critical dimension and the target critical dimension is equal to zero. Thus, the effect of varying the exposure dose of image transfer system 100 is to cause the error profile of the image transfer system, as depicted by lines 32, 32a and 32b in FIG. 4, to move upward or downward. It will be obvious to persons skilled in the art that line 60 of FIG. 4 (and FIGS. 5 and 6) could also depict an actual dimensional value, i.e., the target critical dimension.

Figure 5:
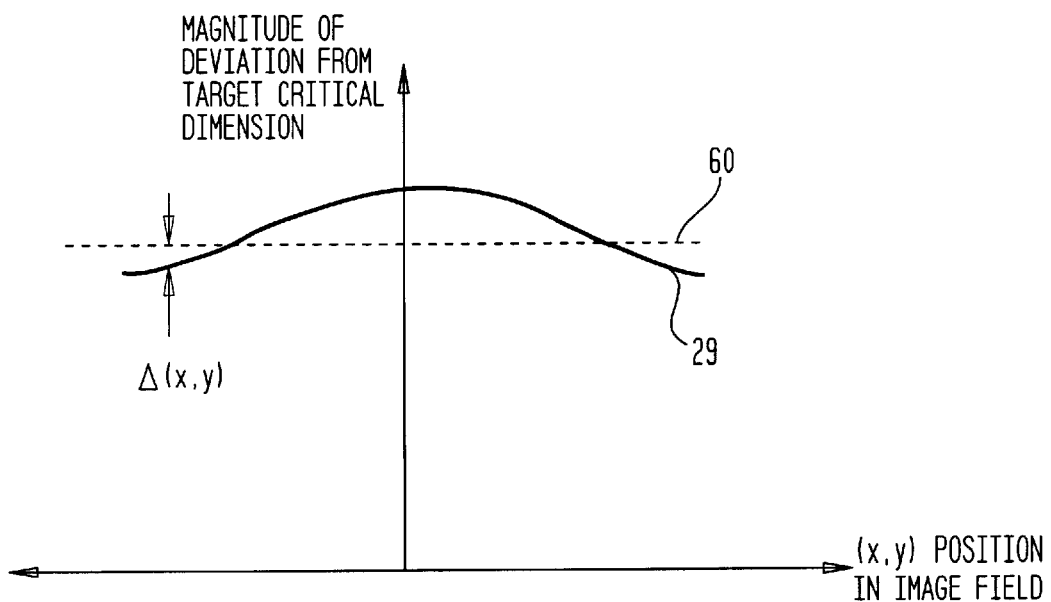
FIG. 5 is a graphical illustration of an error profile derived from an error matrix for a product reticle.

The product reticle 20 is also characterized to determine the amount of error it introduces into the image transfer process. It is common practice for a reticle vendor to provide a reticle error matrix $\Delta(x,y)$ that characterizes the reticle with respect to critical dimension uniformity. As described in detail above, the product reticle 20 has a plurality of features 22 defined therein. Each feature 22 may have an actual dimension that is considered a critical dimension and that should be within the limits of the target critical dimension specification. Typically, the effective target critical dimension specification range is smaller for the mask features than for the photoresist features. The reticle vendor measures the actual dimension of a plurality of features at a plurality of locations to determine the magnitude of deviation (if any) between an actual dimension and the target critical dimension. From there, a reticle error matrix $\Delta(x,y)$ of these measured deviations can be constructed. The reticle error matrix may be provided by the vendor in the form of a computer disk or CD-ROM, or it may be transmitted electronically from the vendor to the end customer (the user of the image transfer system). Thus, the product reticle 20 may be characterized with respect to the target critical dimension so that errors introduced by the reticle 20 into the image transfer process by this component may be quantified and accounted for in adjusting and controlling the image transfer process and the image transfer system 100. Using known techniques, a reticle error profile may be derived as previously described herein, as depicted by line 29 in FIG. 5. Line 29 of FIG. 5 represents the case of a fixed x or y point, where the other point varies.

As described above, the image transfer system error matrix $\delta(x,y)$ and reticle error matrix $\Delta(x,y)$ are comprised of a plurality of discrete x, y points. However, the two error matrices may not be conjugate with each other. It is thus desirable to derive an error profile from each of the error matrices. Thus, line 32 of FIG. 4 and line 29 of FIG. 5 respectively depict an error profile for the image transfer system and for the product reticle. These error profiles are derived from the discrete points of the respective error matrices using known data fitting techniques.

The controller 110 preferably includes means for considering the error data (in the form of the reticle error matrix $\Delta(x,y)$ and/or image transfer system matrix $\delta(x,y)$). Such means may comprise, by way of non-limiting example, computer hardware, software and/or firmware for receiving error data and for storing error data for the matrices, deriving error profiles from the matrix data, combining the matrices, determining the maximum and minimum error values in the combined matrix, calculating the average of the maximum and minimum values to determine a mean error value, and for communicating with and controlling the various components of the image transfer system 100.

In general, the coordinates of the reticle error matrix $\Delta(x,y)$ may not be conjugate with the coordinates of the image transfer system matrix $\delta(x,y)$. This is due in part to the fact that the test reticle typically includes regularly located and spaced lithographic control features (LCFs), whereas the LCFs and associated device features on the product reticle are more randomly located and spaced. Consequently, the relationship between a measured point in the object plane (i.e., on the product reticle) and in the measured point in the image plane (i.e., in the photoresist) may not be a conjugate relationship. In deriving the effective corrected reticle error profile or surface (depicted by line 70 in FIG. 6), the reticle and image transfer system error profiles (depicted, respectively, by lines 32 and 29 in FIGS. 4 and 5) are combined and the fact that the point error data in each matrix $\Delta(x,y)$ and $\delta(x,y)$ may not be conjugate is also considered.

Figure 6:
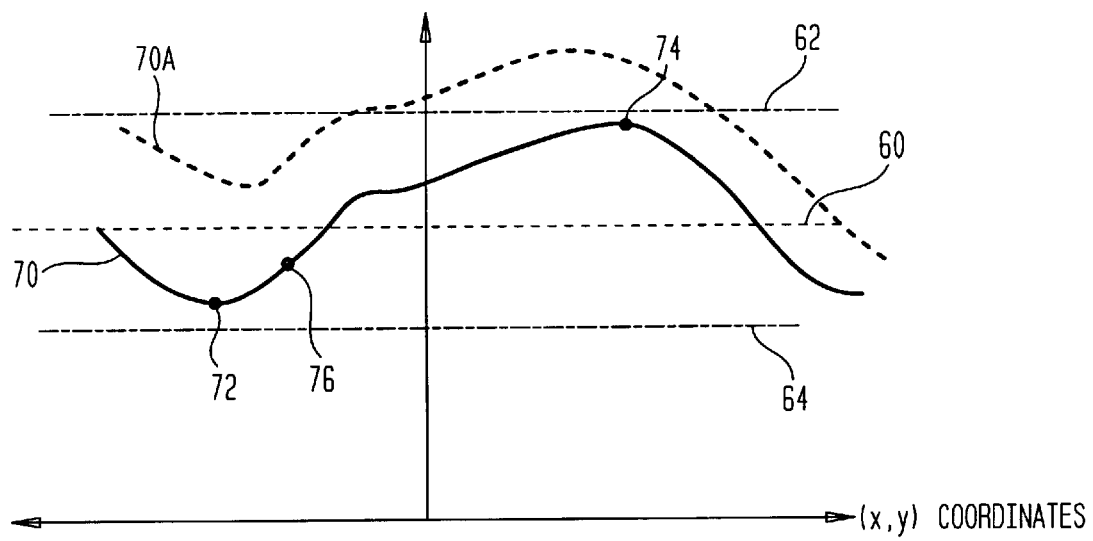
FIG. 6 is a graphical illustration of an effective corrected reticle error profile formed by combining the error profiles of FIGS. 4 and 5.

Referring next to FIG. 6, the effective corrected reticle error profile or surface is depicted by line 70. Line 70 of FIG. 6 represents the case of a fixed x or y point, where the other point varies. This line also represents the combination of line 32 (FIG. 4) and line 29 (FIG. 5) and includes a minimum error value 72 and a maximum error value 74; a mean error being defined as the geometric mean of these errors. Lines 62, 64 represent the upper and lower limits, respectively, of the critical dimension specification. The error profile depicted by line 70 represents the difference between an actual critical dimension ($CD_{Actual}$) and a target critical dimension ($CD_{Target}$). Line 60 thus depicts the instance where the difference between the actual critical dimension and the target critical dimension is approximately equal to zero. The mean error (i.e., the geometric mean of the minimum and maximum error values 72, 74) may be approximately the same as line 60, although this need not be the case as long as at least one of the minimum and maximum error values is within the critical dimension specification limits. The present invention also ensures that the difference between the minimum error value 72 and lower specification limit 64, and the difference between the maximum error value 74 and upper specification limit 62, will be the same. Thus, the present invention defines an operating margin for an image transfer system 100 and an image transfer process that is approximately equal to the difference between a minimum or maximum error value and its respective specification limit.

Line 70a depicted in FIG. 6 represents the error profile or surface of an image transfer system 100 prior to adjustment or correction in accordance with the present invention, with a portion of the error profile lying outside of the critical dimension specification limits.

By combining the reticle error matrix $\Delta(x,y)$ and the image transfer system error matrix $\delta(x,y)$ into a single matrix (referred to herein as the effective corrected reticle error matrix $\Delta c(x,y)$), a significant source of error in the overall image transfer process can be quantified. Consequently, the performance of the image transfer system 100 can be optimized to provide an image transfer process with the largest tolerance for error in the system operation.

The maximum and minimum values contained in the effective corrected reticle error matrix correspond to the points of greatest deviation from the target critical dimension.

Control of the image transfer system 100 is typically accomplished by a system operator in ways generally known in the art. For example, a system operator accessing a control panel (not shown) on the image transfer system 100 may program or enter a plurality of data via a keypad, for example. The data entered by the operator may cause the image transfer system 100 to control various parameters of the image transfer process. For example, the intensity of the illumination source 10 and duration of exposure may be controlled in this manner. Control of other parameters of the image transfer system 100 may be similarly controlled using generally known methods and devices so as to control the image transfer process and image transfer system 100.

The performance of the image transfer system 100 and process may be verified in accordance with the present invention. In an image transfer system 100 operated in accordance with the present invention, a product reticle 20 may be used to pattern a LCF 28 in a photoresist 40 by exposing the photoresist to light energy from the illumination source 10. The LCF 28 will have a predicted error value whose magnitude and location may be included in the reticle error matrix. This dimension thus represents a point in the effective reticle error profile, as represented by line 70 of FIG. 6.

The LCF 28 will also have an actual error value that may be determined using a scanning electron microscope, for example. The difference between the predicted and actual error values is preferably less than or equal to the difference between the maximum or minimum error values 74, 72 and the upper or lower specification limits 62, 64, respectively.

The amount of error data provided in the reticle error matrix and image transfer system error matrix (i.e., the size of the matrices) is a routine matter of design choice. Various factors such as the imaging uniformity of the image transfer system 100 and the capability of the reticle vendor may impact the amount of error data necessary to ensure an adequate level of control over the image transfer process and system. Likewise, the amount of post-image transfer process measurements required to verify the performance of the image transfer system 100 may also depend on a number of factors that are not germane to the present invention.

The present invention is also directed to semiconductor devices having a feature defined therein formed in accordance with the above-described methods. While the above-disclosure has been directed to ensuring that both the maximum and minimum error values are within the target critical dimension specification, the present invention is also directed to the case where either of the maximum and minimum error values are within the target critical dimension specification.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A method of controlling a critical dimension of a feature patterned in a photoresist disposed on a semiconductor wafer, the feature having a target critical dimension and a target critical dimension specification, the feature being patterned using an image transfer system including an energy source and a lens, and a product reticle having a plurality of features defined therein forming a reticle feature pattern and being disposed in the image transfer system, the energy source directing energy through the product reticle and lens to define the reticle feature pattern in the photoresist, said method comprising the steps of:

(a) forming a reticle error profile;
(b) forming an image transfer system error profile;
(c) deriving an effective corrected reticle error profile from the product reticle error profile and the image transfer system error profile;
(d) determining a maximum error value and a minimum error value from the effective corrected reticle error profile; and
(e) controlling the image transfer system so that the maximum error value and the minimum error value are within the target critical dimension specification.

2. The method of claim 1, wherein a feature defined in the product reticle has an actual dimension and wherein said step (a) comprises:

measuring the actual dimension of the feature at a plurality of locations on the product reticle;
recording the location of each measurement and any deviation between the target critical dimension and the measured actual dimension as a product reticle error matrix; and
deriving a reticle error profile of the data in the reticle error matrix.

3. The method of claim 1, wherein said step (b) comprises:

exposing a test feature having an actual dimension in the photoresist using a test reticle;
measuring the test feature actual dimension in the photoresist at a plurality of locations in the photoresist;
recording the location of each measurement and any deviation between the target critical dimension and the measured test feature dimension as an image transfer system error matrix; and
deriving an image transfer system error profile of the data in the image transfer system error matrix.

4. The method of claim 1, wherein a mean error is the geometric mean of the maximum and minimum error values and wherein said step (e) comprises controlling the image transfer system so that the difference between mean error value and the target critical dimension is approximately equal to zero.

5. The method of claim 1, wherein the feature is a lithography control feature having a predicted error value and an actual error value, and wherein said step (f) comprises determining the difference between the predicted error value and the actual error value.

6. The method of claim 5, wherein the image transfer system defines an operating margin and wherein said step (f) further comprises ensuring that the difference between the predicted error value and the actual error value is within an operating margin of the image transfer system.

7. The method of claim 1, wherein said step (c) comprises deriving an effective corrected reticle error that is the combination of the reticle error profile and the image transfer system error profile.

8. A method of controlling an image transfer process for patterning a feature in a photoresist on a semiconductor wafer using an image transfer system having a plurality of image transfer components, at least one of the image transfer components introducing an error in the image transfer process, said method comprising the steps of:

(a) characterizing the error in the image transfer process by considering a maximum and a minimum error value across an image field introduced in the image transfer process by one of the image transfer components; and (b) controlling the image transfer system to compensate for the error so that the maximum and minimum error value fall within a target critical dimension specification for the feature being patterned in the photoresist.

9. The method of claim 8, wherein the image transfer components include a lens and a product reticle that defines a plurality of features, and wherein said step (a) comprises characterizing the error introduced in the image transfer process by the lens.

10. The method of claim 8, wherein the image transfer components include a lens and a product reticle that defines a plurality of features, and wherein said step (a) comprises characterizing the error introduced in the image transfer process by the product reticle.

11. The method of claim 8, wherein the image transfer components include a lens and a product reticle that defines a plurality of features, and wherein said step (a) comprises characterizing the error introduced in the image transfer process by the lens and the product reticle.

12. The method of claim 11, wherein the feature defines a target critical dimension and a target critical dimension specification, and wherein the feature patterned in the photoresist has an actual dimension, wherein said step (b) comprises controlling an exposure dose of the image transfer process so that the actual dimension is within the target critical dimension specification.

13. The method of claim 12, wherein the target critical dimension specification has an upper limit and a lower limit and wherein said step (b) comprises controlling an exposure dose of the image transfer process so that the actual dimension is located approximately mid-way between the upper and lower limits of the target critical dimension specification.

14. A semiconductor device having a feature defined therein formed in accordance with the method of claim 1.

15. A semiconductor device having a feature defined therein formed in accordance with the method of claim 12.

16. A method for manufacturing an integrated circuit employing an imaging method for an imaging system using a reticle, the imaging method comprising the steps of:
(a) providing an image system error profile of the imaging system;
(b) providing a reticle error profile of the reticle;
(c) combining the imaging system error profile and the reticle error profile to determine at least one of a maximum error value and a minimum error value; and
(d) adjusting the imaging system in response to one of the maximum error value and a minimum error value.

17. A method of controlling an image transfer process for patterning a feature in a photoresist on a semiconductor wafer using an image transfer system having a plurality of image transfer components including a lens and a product reticle that defines a plurality of features, at least one of the image transfer components introducing an error in the image transfer process, said method comprising the steps of:
(a) characterizing the error introduced in the image transfer process by the lens and the product reticle; and
(b) adjusting the image transfer system to compensate for the error;
wherein the feature defines a target critical dimension and a target critical dimension specification, and wherein the feature patterned in the photoresist has an actual dimension, wherein said step (b) comprises controlling an exposure dose of the image transfer process so that the actual dimension is within the target critical dimension specification.

18. The method of claim 17, wherein the target critical dimension specification has an upper limit and a lower limit and wherein said step (b) comprises controlling an exposure dose of the image transfer process so that the actual dimension is located approximately mid-way between the upper and lower limits of the target critical dimension specification.

* * * * *